United States Patent [19]

Igari

[11] Patent Number: 5,052,884
[45] Date of Patent: Oct. 1, 1991

[54] TRANSFERRING DEVICE FOR SEMICONDUCTOR WAFERS

[75] Inventor: Kazufumi Igari, Machida, Japan

[73] Assignee: Tokyo Aircraft Instrument Co., Ltd., Tokyo, Japan

[21] Appl. No.: 421,351

[22] Filed: Oct. 13, 1989

[30] Foreign Application Priority Data

Oct. 25, 1988 [JP] Japan .......................... 63-139134[U]
Nov. 18, 1988 [JP] Japan .......................... 63-151004[U]

[51] Int. Cl.$^5$ ............................................. B25J 11/00
[52] U.S. Cl. .................................. 414/744.2; 901/12; 901/19
[58] Field of Search .......................... 414/744.2, 744.3; 901/12, 19, 20

[56] References Cited

U.S. PATENT DOCUMENTS 3,857,496 12/1974 Gonzales ........................ 901/12 X
4,247,244 1/1981 Coyle .............................. 901/12 X

FOREIGN PATENT DOCUMENTS 295432 12/1987 Japan ..................................... 901/12

Primary Examiner—Robert J. Spar
Assistant Examiner—William M. Hienz
Attorney, Agent, or Firm—Spencer & Frank

[57] ABSTRACT

Transferring device for a semiconductor wafer or like part includes a rotatable carrying arm rotatably for carrying a semiconductor wafer or part from its initial position and through a first angle. The rotatable carrying arm has a holding portion for a wafer or part, and a cam follower portion. A motor rotates the rotatable carrying arm through an angle slightly greater than the first angle slightly past a desired position for the wafer. Then, an eccentric cam returns the carrying arm through a second, incremental angle, for bringing the carrying arm, and, hence, the wafer held thereby, to the desired position.

6 Claims, 3 Drawing Sheets

FIG. 5

TRANSFERRING DEVICE FOR SEMICONDUCTOR WAFERS

BACKGROUND OF THE INVENTION

The present invention relates to a transferring device for a semiconductor wafer, which device locates a semiconductor wafer in a predetermined position and then transfers it to the desired position. The transferring device can be used in the process of manufacturing or inspecting semiconductor wafers.

There is a need to transfer parts, such as semiconductor wafers, and stop them at a predetermined position, or alternatively, to change or correct the stop position and maintain the correct position.

Particularly, it is essential to stop a part or an object to be inspected or worked on at a predetermined position. And for determining the stop position, positioning stoppers have been used. In such conventional stoppers, it is usual that parts to be inspected hit against a stopper and are stopped there, and after the stopper is retracted from the parts path, the part is then allowed to move further. Usually the stopper retracts from the path of the parts while rubbing against the parts.

In most cases, manufacturing and inspection processes of semiconductor wafers are preformed in a clean room. Damages might be caused to the wafers. Not only this, there has been the problem of generation of dust by the rubbing between the semiconductor wafers and the conventional movable stopper.

There has been therefore a proposal for a stopper which does not rub the semiconductor wafers, or parts when retracting.

FIG. 1 is a schematic view for explaining such a conventional stop position determining device for parts, according to the above proposal.

In that device, a conveying belt 3 feeds parts 1 from left to right in the figure. In the case of the above mentioned conventional stopper which causes rubbing by the stopper, the stopper is allowed to move only in the Y direction shown in the figure. In this proposal (FIG. 1), a stopper 5 is driven to be able to move both in the X and Y directions by the respective X axis drive source 6 and Y axis driving source 8.

When the stopper 5 protrudes at the position shown in FIG. 1 and shown with slanting lines, the part 1 hits against the stopper 5 and is stopped by it. At the state when the belt 3 is stopped, the stopper 5 is moved to the right (in the figure) by the X-axis drive source 6, and then is lowered downwardly by the Y-axis drive source 8. Thus the stopper 5 moves away from the parts 1 to allow a further conveying thereof.

When the stopper 5 passes the position shown in FIG. 1 and is stopped there, it is possible to protrude the stopper 5 by the Y-axis drive source 8 at a further remote position, and then to bring it back to the left in the figure by the X-axis drive source 6 to stop it there.

The device of FIG. 1 can solve the problem of rubbing, if operated correctly, as explained. However, the above conventional device requires two drive sources 6 and 8 for the respective lateral (in the X direction) and vertical (in the Y direction) movements of the stopper 5.

Further, if the sequence of driving the sources 6 and 8 is not correctly performed, there might occur a problem of rubbing of parts at the time of vertical movement of the stopper 5 by the Y-axis drive source 8.

On the other hand, there is a need handle a part such as a semiconductor wafer whose angular position once trued up is desired to be rotated through example, for 180° for the next working process. In such a positioning mechanism for transferring parts through 180 degrees by rotation, a pulse motor has been used. In a pulse motor, a high resolution drive can be carried out. The resolution may be improved by stepping down, and for further improving the resolution, it is possible to provide an encoder, so as to feed-back a signal.

With such a structure, a more precise transfer through 180 degrees may be possible, but the stucture of the system is complicated and expensive to manufacture.

An object of the present invention is, therefore, to provide a transferring device for a semiconductor wafer having a stop position determining device for parts such as semiconductor wafers, which can solve the above-mentioned problems with a rather simple structure.

Another object of the present invention is to provide a transferring device for a semiconductor wafer with a conveying arm having a position determining mechanism, which can rotate parts, precisely through a determined angle with a simple structure.

SUMMARY OF THE INVENTION

A transferring device of a semiconductor wafer according to the present invention comprises a stopper which is driven to move obliquely from forward of a feed path of parts, to the feed path, to stop the parts, there, thereafter to retract along the same oblique path, and to allow further movement of the parts, along the oblique path; and a stop position determining device of the parts, consisting of means for driving the stopper along the oblique path.

A transferring device for a semiconductor wafer according to the present invention comprises: a rotatable carrying arm rotatably carrying a flat surface position of a part from its initial position a through predetermined angle, the rotatable carrying arm being provided with a holding portion for the parts, and a cam follower portion. A motor rotates the rotatable carrying arm through an angle slightly larger than the predetermined angle. Then, an eccentric cam returns the carrying arm through a small angle, the arm already having been driven at this time through an the angle slightly larger than the predetermined angle, and, thus, the part is precisely brought to the initial, desired position.

DESCRIPTION OF THE PREFERRED EMBODIMENTS

The present invention will be explained in further detail with reference to the attached drawings.

Figure 1:
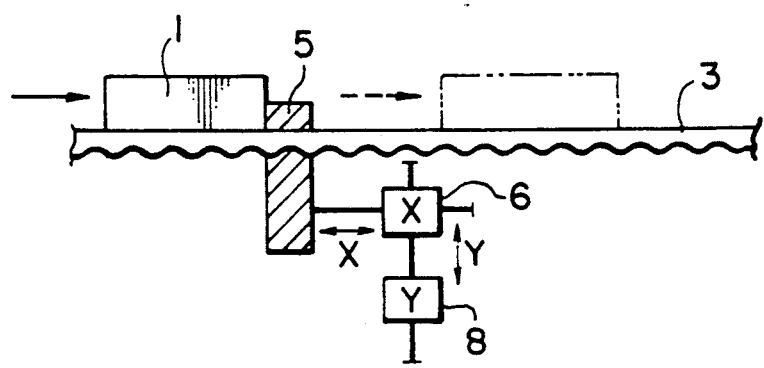
FIG. 1 is a schematic view for explaining an example of a stop position determining mechanism of a conventional transferring device for a semiconductor wafer.
Figure 2:
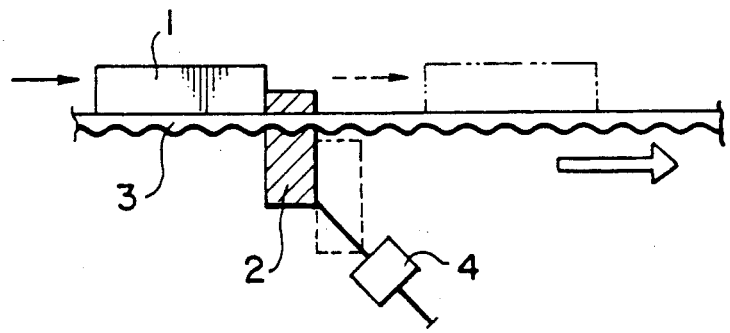
FIG. 2 is a schematic view showing an embodiment of a stop-position determining device for parts, such as semiconductor wafers, according to the present invention.

FIG. 2 is a schematic view showing an embodiment of a stop-position determining device for parts, such as semiconductor wafers, according to the present invention.

A stopper 2 moving obliquely is driven by a stopper drive source 4 consisting of an air cylinder. The stopper 2 being driven from the position shown in a broken line in FIG. 2 to the position of a real line stops a parts at a determined position. The stopper 2 then retracts to the position of the broken line, to allow further movement of the parts 1.

With this structure, the parts 1 fed on a conveying belt 3 hits against the stopper 2 and is stopped there, and after necessary work is carried out on one of the part 1, the parts 1 is further fed toward the stopper 2. During this process, protrusion and retraction of the stopper 2 may be carried out with a single drive source. Also, at the time of movement of the stopper 2, it retraction without rubbing the part 1.

Figure 3:
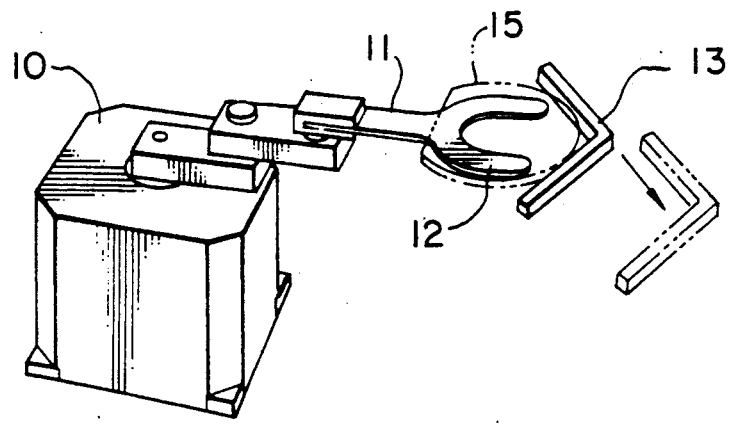
FIG. 3 is a perspective view of a second embodiment of a stop-position determining device for parts, such as semiconductor wafers, according to the present invention, in which the stop-position of a semiconductor wafer is determined by using a stopper moving obliquely.

FIG. 3 is a perspective view of a second embodiment of a stop-position determining device for parts, such as a semiconductor wafer 15, according to the present invention, in which the stop-position of a semiconductor wafer is determined by using a stopper 13 which is obliquely movable.

An arm 11 having articulations is driven by an arm drive motor 10. The arm 11 is provided with a suction fork 12, which takes out a semiconductor wafer 15 from a wafer basket, not shown, and supplies it to a position determining station.

A stopper 13 moving obliquely is provided for the position determining station, and the semiconductor wafer 15 is located and stopped at this position determining station according to the above-mentioned principle of operation.

The stopper 13 in the bent form is to agree its locating center with a center of a receiving stand in the station. Since the stopper 13 is guided obliquely and driven by a driving source, for example an air cylinder, not shown.

Figure 4:
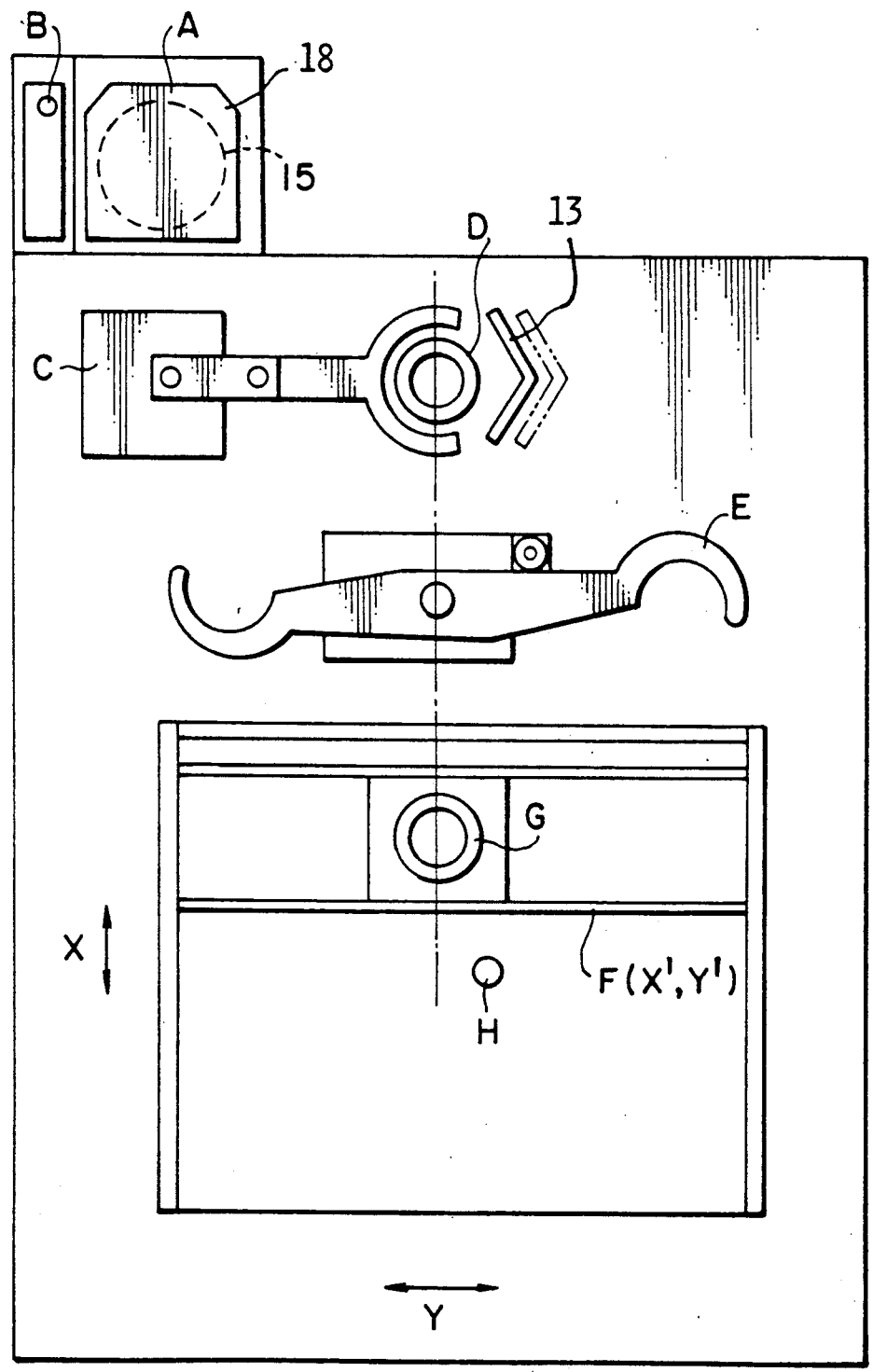
FIG. 4 is a plan view of a measuring device for an extremely small displacement of a semiconductor wafer in which the device of FIG. 3 is used.

FIG. 4 is an arrangement plan view of a measuring device for extremely small displacement of a semiconductor wafer in which the stop-position determining device of the embodiment shown in FIG. 3 is used.

In a wafer basket elevating device A, a wafer basket 18 is disposed. At the time of starting the operation of an extremely small displacement measuring device, an initial position of the wafer basket is determined, if required, by a stop-position fine adjustment station B.

After the initial position of the wafer basket is determined, the elevating device A is driven from the determined position by a predetermined amount. By using a wafer detecting device provided in the wafer basket, the presence of a semiconductor wafer 15 is detected.

Only when wafer 15 is present, a wafer transfer arm C (or wafer take-out robot as shown in FIG. 3) transfers a required semiconductor wafer in wafer basket 18 to an alignment stage D.

The wafer transfer arm C is a robot having articulations (shown in FIG. 3) and is inserted beneath a semiconductor wafer, exerts a suction force, and holds the wafer by a vacuum developed there.

The alignment stage D is a stage used for locating a center of a semiconductor wafer with a reference point. In the alignment stage D, the stopper 13 is provided.

The semiconductor wafer thus aligned at the alignment stage D is transferred by a rotatable changing arm E to a $Z\theta$ stage G which is supported by an X-Y stage F.

An optical microscope H is disposed with respect to these stages, with which the relative position of a position mark formed on a semiconductor wafer is carefully measured.

As fully explained above, the embodiment of the device of the present invention consists of an obliquely movable stopper and means for driving the stopper. The stopper extends obliquely from in front of the feed path of parts, such as a silicon wafer 15, to reach the feed path. The stopper stops the parts, and thereafter retracts along the same path as the path of extension to allow a further movement of the parts. The driving means drives the stopper along the oblique path.

Since the stopper does not rub against the parts while it is moved, it is useful when damage of parts, such as wafers, must essentially be avoided, or when it is used in a clean room for manufacturing semiconductor wafers where generation of dust must rigorously be avoided.

Since only a single drive source is used, the manufacturing cost of the device is low.

The above-mentioned device may be utilized in an extremely small displacement measuring device used in the treatment of semiconductor wafers.

Figure 5:
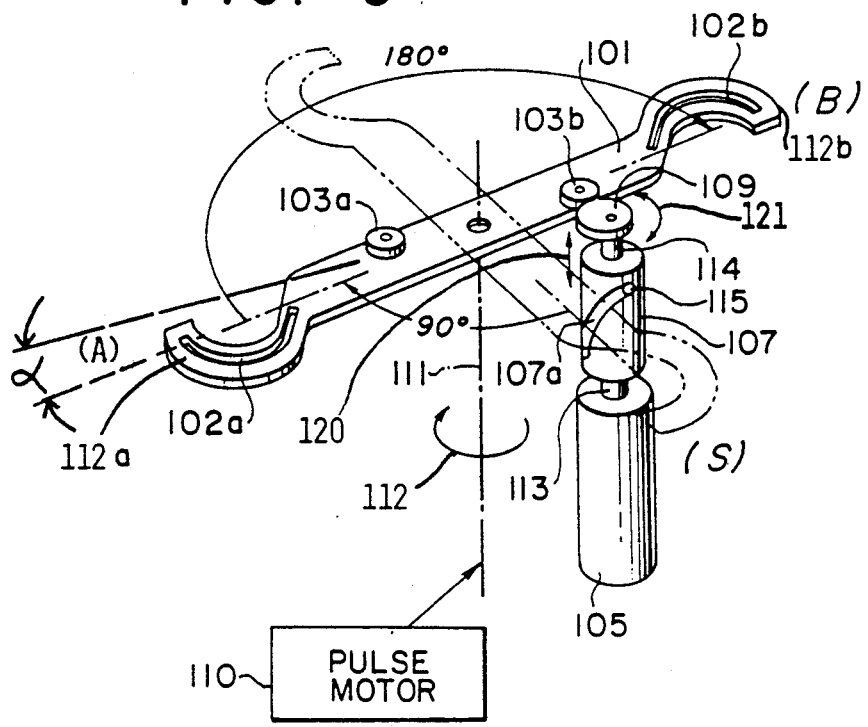
FIG. 5 is a perspective view of an embodiment of a carrying arm provided with a position determining mechanism for a transferring device of a semiconductor wafer according to the present invention.
Figure 6:
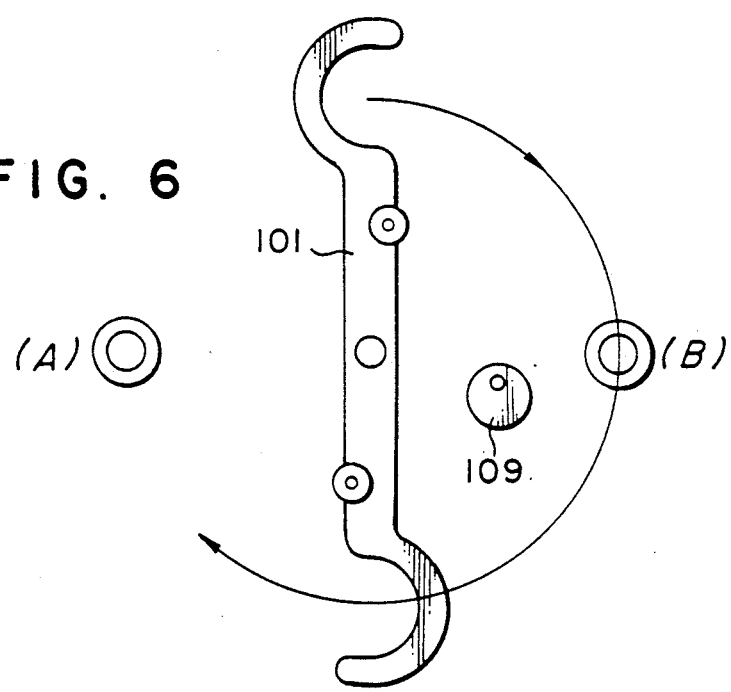
FIG. 6 is a plan view of the mechanism of FIG. 5.

Fig. 5 is a perspective view of an embodiment of a carrying arm provided with a locating mechanism for a transferring device of a semiconductor wafer according to the present invention. FIG. 6 is a partial plan view of the mechanism of FIG. 5.

A rotatable carrying arm 101 is connected with an arm drive shaft 111 which is connected with an output axle of a pulse motor 110 so as not to generate any play in the rotational direction 112.

This plate-like rotatable carrying arm 101 is provided at both ends thereof with semicircular wafer carrying portions 112a and 112b, the wafer carrying portions having shapes symmetrical with respect to a center of rotation of the arm drive axle 111. The semicircular portions 112a and 112b are provided with suction grooves 102a and 102b respectively for holding semiconductor wafers, and which are connected with respective negative pressure supply sources, not shown, through air passages provided within the plate.

In the body portion of the rotatable carrying arm 101 there are provided cam follower rollers 103a and 103b, respectively, and each cam follower roller is disposed on the same side of carrying arm 101 as the openings of the semiconductor wafer carrying portions 112a and 112b.

The cam follower rollers 103a and 103b are symmetrical with each other and symmetrically disposed with respect to the arm drive axle 111. A cylinder 107 having a grooved cam 107a is fixed in parallel with the cam drive axle 111 and the grooved cam 107a guides a pin 115 of an axle 114, the axle 114 holding an eccentric cam 109. An output axle 113 of the air cylinder 105 is connected with the pin 115. The axle 114 is raised in the direction of arrow 120 by the air cylinder 105, by which the eccentric cam 109 is raised while rotating in the anticlockwise direction of arrow 121 in the figure.

At first, the rotatable carrying arm 101 is at the point of origin (S) as shown in broken line, and from this position (S) the arm 101 rotates through 90+α degrees (α being an extremely small angle) to one of positions (A), (B) shown in the figure where the arm 101 engages a semiconductor wafer.

In this time period, the eccentric cam 109 is below the position of the cam follower roller 103b, and when the rotatable carrying arm 101 reaches the position (B), the eccentric cam 109 draws near the cam follower roller 103b while being raised upwardly by the air cylinder 105.

The eccentric cam 109 then rises while rotating until it strikes the roller 103b and pushes the roller 103b by its rotational power, thus relocating the rotatable carrying arm 101 to either one of positions (A) and (B) by returning it through the angle α. The arm 101 then engages a wafer, and eccentric cam 109 retracts.

In order to determine the position precisely in a mechanical way, the roller and eccentric cam are manufactured with a high degree of precision.

As fully explained above, the carrying arm according to the present invention includes a locating mechanism which rotates and carries the flat surface portion from its initial position through a certain angle, a rotative carrying arm provided with a holding portion for parts, and a follower portion. There is a motor which rotates the rotatable carrying arm through an angle slightly larger than the predetermined angle; and an eccentric cam which returns the carrying arm through a certain angle, the arm having been driven through the angle slightly larger than the predetermined angle, and then the cam retracts.

Thus, precise locating can be made with simple mechanism using a direct-acting cylinder and rotatable cam. The cost could also be lowered.

What is claimed is:

1. A transferring device for moving a semiconductor wafer from a first location to a second location, comprising:
    a rotatable carrying arm having an axis of rotation, said carrying arm including a first holding member for holding the semiconductor wafer;
    a first cam follower member disposed on said rotatable carrying arm;
    drive means coupled to said rotatable carrying arm, said drive means rotating said carrying arm in a first direction past a predetermined position and through an incremental angle;
    an eccentric cam having a first position in which it is disengaged from said cam follower member and a second position in which it is engaged with said cam follower member; and
    cam driver means coupled to said eccentric cam for translating and rotating said eccentric cam from said first position to said second position, the rotation of said eccentric cam rotating said carrying arm in a second direction opposite to said first direction through said incremental angle, and said cam driver means returning said eccentric cam to said first position.

2. A transferring device as defined in claim 1, wherein said drive means comprises a pulse motor.

3. A transferring device as defined in claim 1, wherein said cam driver means comprises an air cylinder.

4. A transferring device as defined in claim 1, further comprising a second holding member and a second cam follower member disposed on said carrying arm.

5. A transferring device as defined in claim 4, wherein said first and second holding members and said first and second cam follower members are symmetrically disposed.

6. A transferring device as defined in claim 4, wherein said first and second holding members and said first and second cam follower members are symmetrically disposed relative to said axis of rotation of said rotatable carrying arm.

* * * * *